(12) United States Patent
Woo

(10) Patent No.: US 11,616,059 B2
(45) Date of Patent: Mar. 28, 2023

(54) SEMICONDUCTOR DEVICE AND METHOD OF FABRICATING THE SAME

(71) Applicant: SAMSUNG ELECTRONICS CO., LTD., Suwon-si (KR)

(72) Inventor: Jong Sung Woo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 95 days.

(21) Appl. No.: 17/306,585

(22) Filed: May 3, 2021

(65) Prior Publication Data
US 2022/0068916 A1 Mar. 3, 2022

(30) Foreign Application Priority Data
Sep. 3, 2020 (KR) .................. 10-2020-0112003

(51) Int. Cl.
| | |
|---|---|
| H01L 29/76 | (2006.01) |
| H01L 29/94 | (2006.01) |
| H01L 31/062 | (2012.01) |
| H01L 27/088 | (2006.01) |
| H01L 29/06 | (2006.01) |
| H01L 21/02 | (2006.01) |
| H01L 29/423 | (2006.01) |
| H01L 27/108 | (2006.01) |

(52) U.S. Cl.
CPC ...... *H01L 27/088* (2013.01); *H01L 21/02532* (2013.01); *H01L 27/10894* (2013.01); *H01L 29/0649* (2013.01); *H01L 29/42364* (2013.01)

(58) Field of Classification Search
CPC ............. H01L 27/088; H01L 21/02532; H01L 27/10894; H01L 29/0649; H01L 29/42364; H01L 21/02639; H01L 21/823481; H01L 21/823456; H01L 21/823462; H01L 21/823468
USPC ........................................................ 257/368
See application file for complete search history.

(56) References Cited

U.S. PATENT DOCUMENTS

| | | | |
|---|---|---|---|
| 8,212,322 B2 | 7/2012 | Frank et al. | |
| 9,721,962 B1 | 8/2017 | Ramkumar | |
| 9,911,746 B1 | 3/2018 | Ramkumar | |
| 10,535,676 B2 | 1/2020 | Chuang et al. | |
| 10,665,614 B2 | 6/2020 | Song et al. | |
| 2013/0092991 A1* | 4/2013 | Liao ................ | H01L 29/40114 257/E21.409 |
| 2015/0060989 A1* | 3/2015 | Loiko ................ | H01L 29/6659 438/587 |

(Continued)

*Primary Examiner* — Theresa T Doan
(74) *Attorney, Agent, or Firm* — F. Chau & Associates, LLC

(57) ABSTRACT

A semiconductor device includes a substrate that includes peripheral and logic cell regions, a device isolation layer that defines a first active pattern on the peripheral region and second and third active patterns on the logic cell region, and first to third transistors on the first to third active patterns. Each of the first to third transistors includes a gate electrode, a gate spacer, a source pattern and a drain pattern. The second active pattern includes a semiconductor pattern that overlaps the gate electrode. At least a portion of a top surface of the device isolation layer is higher than a top surface of the second and third active patterns. A profile of the top surface of the device isolation layer includes two or more convex portions between the second and third active patterns.

9 Claims, 11 Drawing Sheets

(56) References Cited

U.S. PATENT DOCUMENTS

2019/0355614 A1 11/2019 Liew et al.
2019/0371806 A1 12/2019 Ramkumar

* cited by examiner

FIG. 4
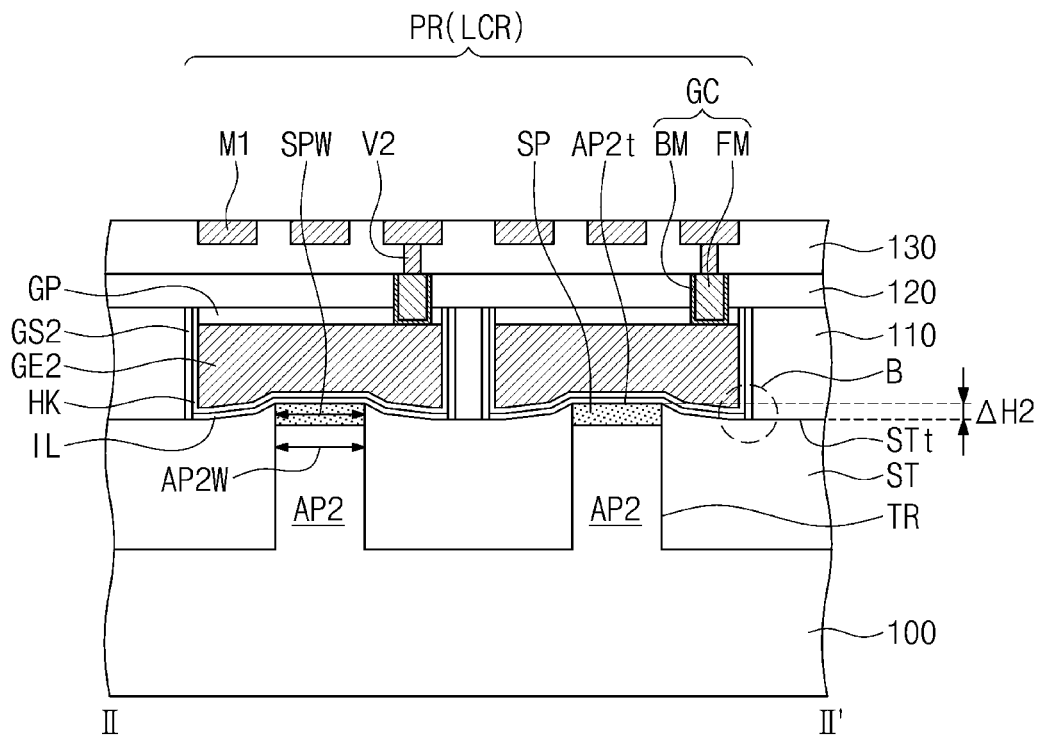
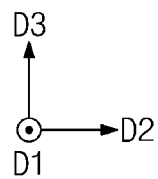
FIG. 5
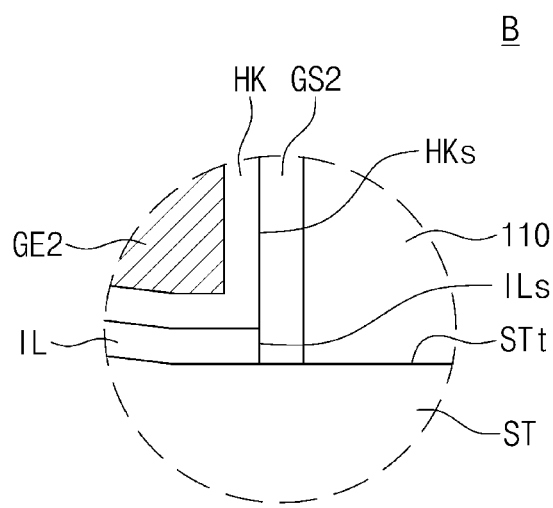

SEMICONDUCTOR DEVICE AND METHOD OF FABRICATING THE SAME

CROSS-REFERENCE TO RELATED APPLICATION

This U.S. non-provisional application claims priority under 35 U.S.C § 119 from Korean Patent Application No. 10-2020-0112003, filed on Sep. 3, 2020 in the Korean Intellectual Property Office, the contents of which are herein incorporated by reference in their entirety.

TECHNICAL FIELD

Embodiments of the present inventive concepts are directed to a semiconductor device and a method of fabricating the same, and more particularly, to a semiconductor device that includes a field effect transistor and a method of fabricating the same.

DISCUSSION OF THE RELATED ART

A semiconductor device includes an integrated circuit that includes metal oxide semiconductor field effect transistors (MOSFETs). As sizes and design rules of semiconductor devices have gradually decreased, sizes of the MOSFETs have also been increasingly scaled down. The scale down of the MOSFETs may deteriorate operating characteristics of the semiconductor device. Accordingly, methods of fabricating semiconductor devices that have superior performance while overcoming limitations caused by high integration of the semiconductor devices have been studied.

SUMMARY

Some embodiments of the present inventive concepts provide a semiconductor device with improved electrical characteristics and increased reliability.

Some embodiments of the present inventive concepts provide a method of fabricating a semiconductor device that reduces manufacturing cost and time.

According to some embodiments of the present inventive concepts, a semiconductor device comprises: a substrate that includes a peripheral region and a logic cell region, a device isolation layer that defines a first active pattern on the peripheral region, a second active pattern on the logic cell region, and a third active pattern on the logic cell region; and first, second, and third transistors on the first, second, and third active patterns, respectively. Each of the first, second, and third transistors includes a gate electrode, a gate spacer that covers a sidewall of the gate electrode, source pattern on a first side of the gate electrode and a drain pattern on a second side of the gate electrode opposite to the first side. The second active pattern includes a semiconductor pattern in an upper portion of the second active pattern. The semiconductor pattern overlaps the gate electrode. At least a portion of a top surface of the device isolation layer is located at a higher level than a top surface of the second active pattern and a top surface of the third active pattern. A profile of the top surface of the device isolation layer has two or more convex portions between the second active pattern and the third active pattern.

According to some embodiments of the present inventive concepts, a semiconductor device comprises: a substrate that includes a peripheral region and a logic cell region; a device isolation layer that defines a first active pattern on the peripheral region, a second active pattern on the logic cell region, and a third active pattern on the logic cell region; first, second, and third transistors on the first, second, and third active patterns, respectively; an interlayer dielectric layer that covers the first, second, and third transistors; and a plurality of active contacts and a gate contact that penetrate at least a portion of the interlayer dielectric layer and are correspondingly connected to the first, second, and third transistors. Each of the first, second, and third transistors includes: a gate dielectric layer on a corresponding pattern of the first, second, and third active patterns; a gate electrode on the gate dielectric layer and electrically connected to the gate contact; a gate spacer that covers a sidewall of the gate electrode; a pair of source/drain patterns in an tipper portion of a corresponding one of the first, second, and third active patterns and on both sides of the gate electrode, the pair of source/drain patterns being electrically connected to the active contacts; and a high-k dielectric layer between the gate electrode and the gate dielectric layer and between the gate electrode and the gate spacer. A thickness of the gate dielectric layer in the first transistor is greater than a thickness of the gate dielectric layer in each of the second and third transistors. The second active pattern may include a semiconductor pattern in an upper portion of the second active pattern. The semiconductor pattern may overlap the gate electrode. At least a portion of a top surface of the device isolation layer may be located at a level higher than a level of a top surface of the second active pattern and than a level of a top surface of the third active pattern. A profile of the top surface of the device isolation layer may have two or more concave portions between the second active pattern and the third active pattern.

According to some embodiments of the present inventive concepts, a method of fabricating a semiconductor device comprises: preparing a substrate that includes a peripheral region and a logic cell region; patterning the substrate to form a trench that defines a first active pattern on the peripheral region, a second active pattern on the logic cell region, and a third active pattern on the logic cell region; filling the trench with a device isolation layer; forming a dielectric layer that covers the device isolation layer and the first, second, and third active patterns; performing a first etching using a first photoresist pattern that removes a portion of the second active pattern and a portion of the dielectric layer on the second active pattern, where the first photoresist pattern has a first opening that exposes the second active pattern; forming a semiconductor pattern on the second active, pattern; and performing a second etching using a second photoresist pattern that removes the dielectric layer that remains on the third active pattern, where the second photoresist pattern has a second opening that exposes the second and third active patterns. Between the second active pattern and the third active pattern, a profile of a top surface of the device isolation layer has two or more concave portions.

BRIEF DESCRIPTION OF THE DRAWINGS

FIGS. 2 and 4 are cross-sectional views taken along lines I-I' and II-II' of FIG. 1, of a semiconductor device according to some embodiments of the present inventive concepts.

FIG. 5 is an enlarged view of section B of FIG. 4, of a semiconductor device according to some embodiments of the present inventive concepts.

DETAILED DESCRIPTION OF EMBODIMENTS

The following will now describe a semiconductor device and a method of fabricating the same according to some embodiments of the present inventive concepts in conjunction with the accompanying drawings.

Herein, when one value is described as being about equal to another value, e.g. "a width may be from about 0.1 mm to about 1 mm", it is to be understood that the values are equal to each other to within a measurement error, or if measurably unequal, are close enough in value to be functionally equal to each other as would be understood by a person having ordinary skill in the art.

Figure 1:
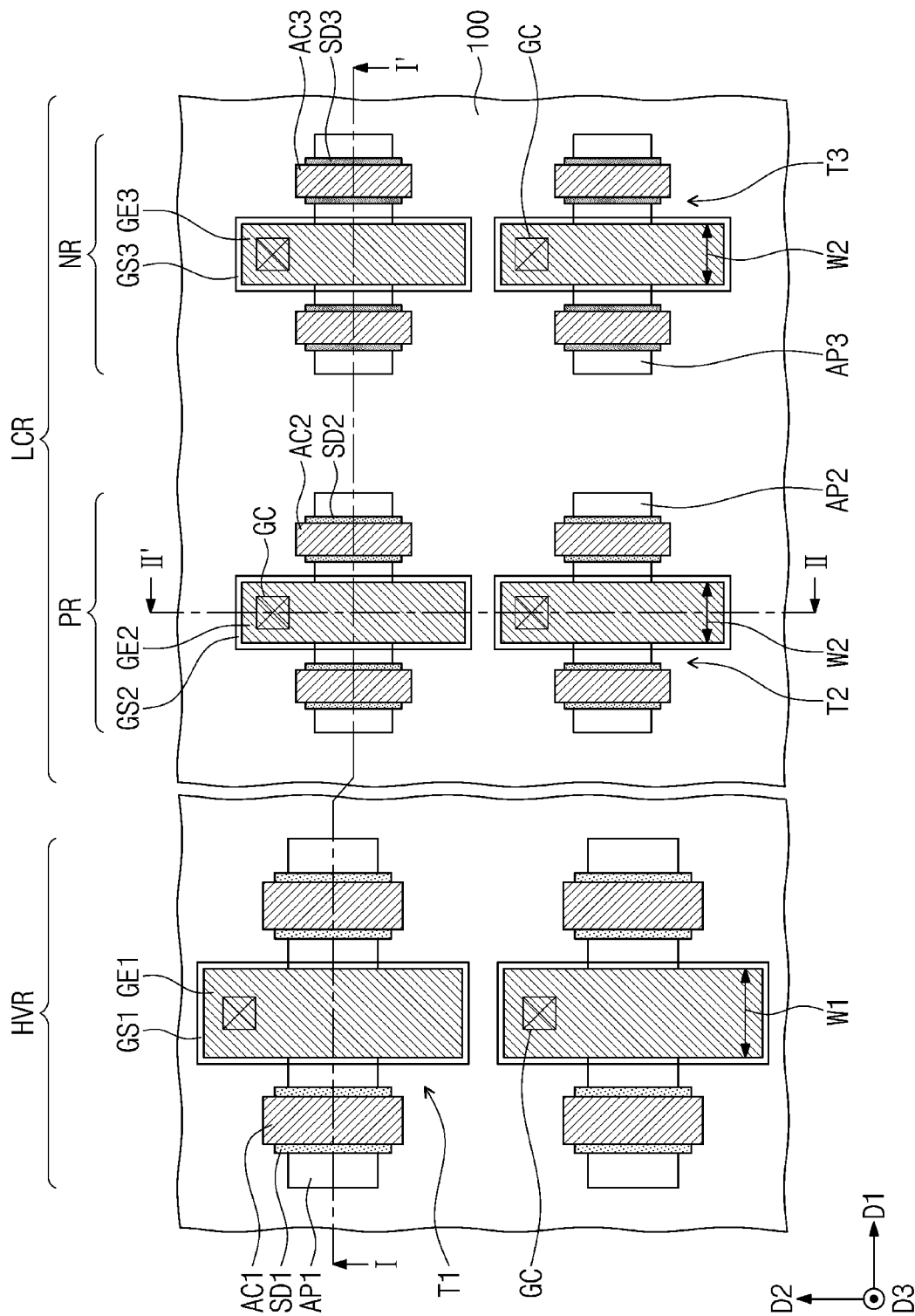
FIG. 1 is a plan view of a semiconductor device according to some embodiments of the present inventive concepts.
Figure 2:
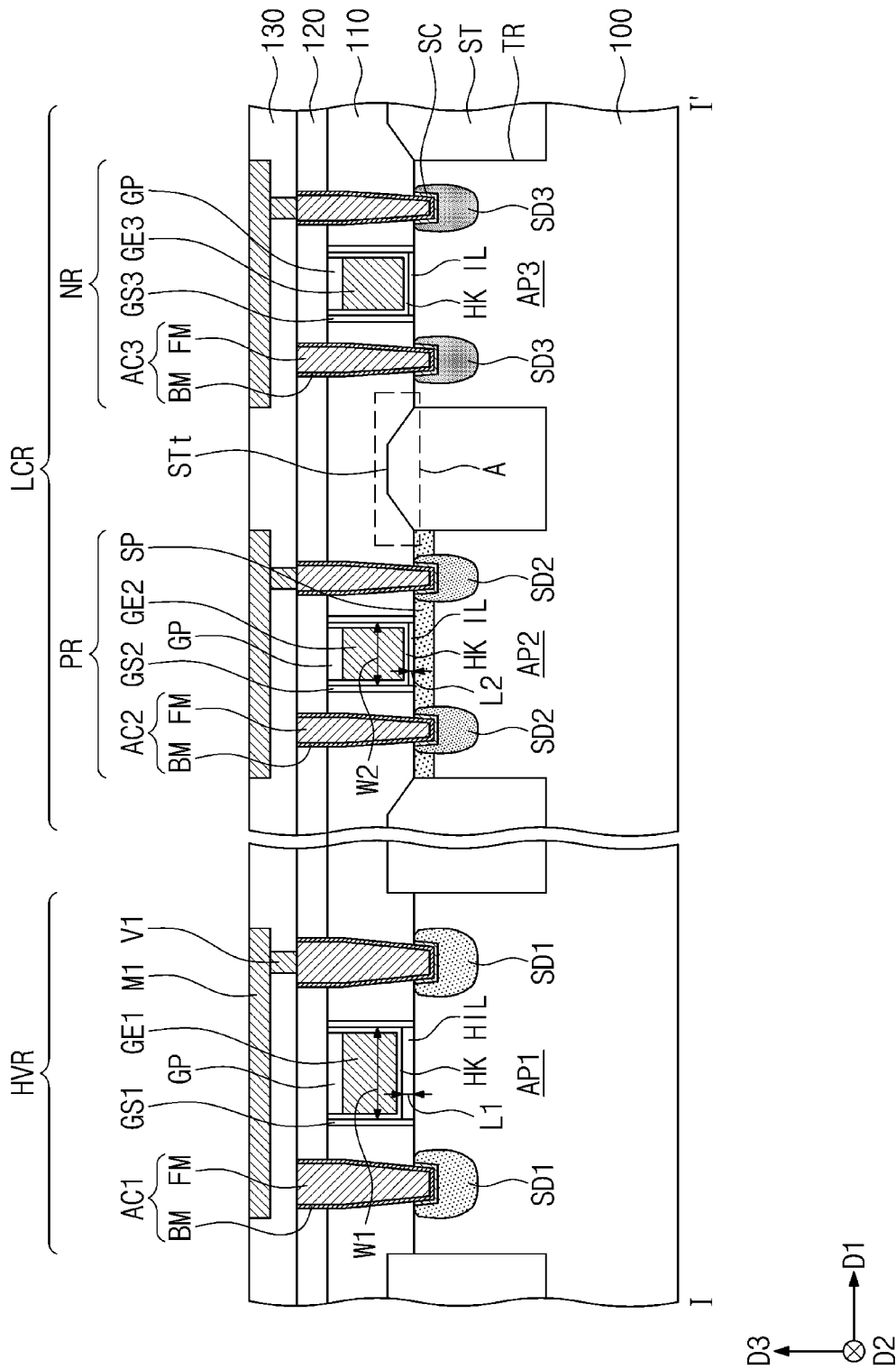
Figure 3:
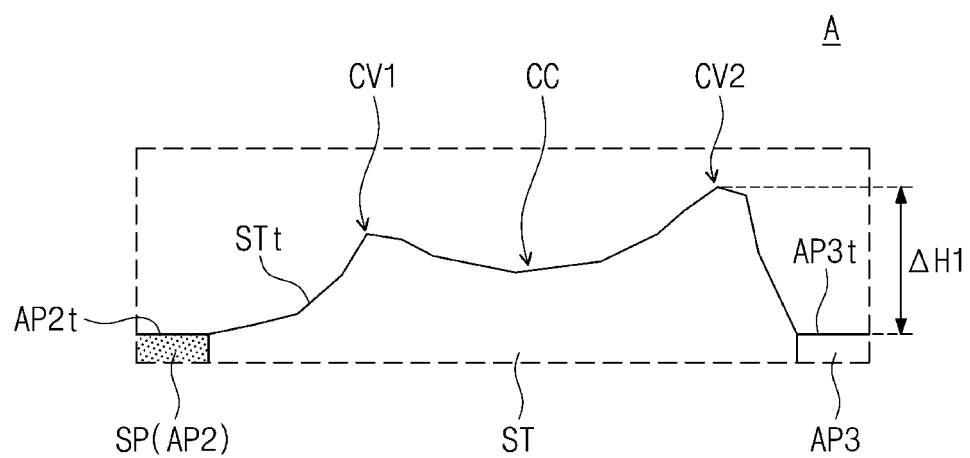
FIG. 3 is an enlarged view of section A of FIG. 2, of a semiconductor device according to some embodiments of the present inventive concepts.

FIG. 1 is a plan view of a semiconductor device according to some embodiments of the present inventive concepts. FIGS. 2 and 4 are cross-sectional views taken along lines I-I' and II-II' of FIG. 1, of a semiconductor device according to some embodiments of the present inventive concepts. FIG. 3 is an enlarged view of section A of FIG. 2, of a semiconductor device according to some embodiments of the present inventive concepts. FIG. 5 is an enlarged view of section B of FIG. 4, of a semiconductor device according to some embodiments of the present inventive concepts.

Referring to FIGS. 1 to 5, according to some embodiments, a substrate 100 includes a peripheral region HVR and a logic cell region LCR. The substrate 100 may be, for example, a compound semiconductor substrate or a semiconductor substrate that includes at least one of silicon (Si), germanium (Ge), or silicon-germanium (SiGe). For example, the substrate 100 is a silicon substrate. The substrate 100 has a top surface that is parallel to a first direction D1 and a second direction D2 that crosses the first direction and is orthogonal to a third direction D3. The first, second, and third directions D1, D2, and D3 are mutually perpendicular.

According to some embodiments, the peripheral region HVR is where transistors that constitute a process core or input/out terminals are disposed. A first transistor T1 is provided on the peripheral region HVR. A transistor on the peripheral region HVR operates at higher power than that required for operating a transistor on the logic cell region LCR.

According to some embodiments, the logic cell region LCR is where cells that constitute a logic circuit are disposed. The logic cell region LCR includes a first cell region PR and a second cell region NR. For example, the peripheral region HVR and the logic cell region LCR are arranged along the first direction D1. The first cell region PR is where PMOS field effect transistors are disposed, and the second cell region NR is where NMOS field effect transistors are disposed. A second transistor T2 is provided on the first cell region PR, and a third transistor T3 is provided on the second cell region NR.

According to some embodiments, a first active pattern AP1, a second active pattern AP2, and a third active pattern AP3 are defined by a trench TR formed in an upper portion of the substrate 100. For example, the trench is positioned between the first, second, and third active patterns AP1, AP2, and AP3. The first active pattern AP1, the second active pattern AP2, and the third active pattern AP3 are respectively provided on the peripheral region HVR, the first cell region PR, and the second cell region NR. The peripheral region HVR, the first cell region PR, and the second cell region NR are spaced apart from each other in the first direction D1 across the trench TR. The first, second, and third active patterns AP1, AP2, and AP3 extend in the first direction D1. The first, second, and third transistors T1, T2, and T3 are respectively provided on the first, second, and third active patterns AP1, AP2, and AP3.

According to some embodiments, the first, second, and third active patterns AP1, AP2, and AP3 are portions of the substrate 100 that protrude in the third direction D3. However, in other embodiments, each of the first, second, and third active patterns AP1, AP2, and AP3 may have widths in the first and second directions D1 and D2 that decrease in the third direction D3.

According to some embodiments, the trench TR is filled with a device isolation layer ST. The device isolation layer ST includes, for example, silicon oxide. The device isolation layer ST covers none of upper portions of the first, second, and third active patterns AP1, AP2, and AP3. The device isolation layer ST covers a sidewall of each of the first, second, and third active patterns AP1, AP2, and AP3. The device isolation layer ST that fills the trench TR defines the first active pattern AP1 on the peripheral region HVR, and also defines the second and third active patterns AP2 and AP3 on the logic cell region LCR.

According to some embodiments, on the peripheral region HVR, a plurality of first active patterns AP1 and first transistors T1 are provided that are spaced apart from each other in the second direction D2. For convenience of description, the following will focus on a single first active pattern AP1 and a single first transistor T1, but embodiments of the present inventive concepts are not limited thereto.

According to some embodiments, a pair of first source/drain patterns SD1 are provided in an upper portion of the first active pattern AP1. The first source/drain patterns SD1 are impurity regions of a first conductivity type, such as a p-type, or a second conductivity type, such as an n-type. A channel region of the first transistor T1 is defined between the pair of first source/drain patterns SD1. Each of the first source/drain patterns SD1 has a top surface at substantially the same level as that of, i.e., coplanar with, a top surface of the first active pattern AP1. The first source/drain patterns SD1 include, for example, the same semiconductor element as that of the substrate 100. For example, the first source/drain patterns SD1 includes silicon (Si).

According to some embodiments, a first gate electrode GE1 is provided that extends in the second direction D2 across the first active pattern AP1. The first gate electrode GE1 is provided between the pair of first source/drain patterns SD1. In other words, the first source pattern is provided on a first side of the first gate electrode GE1, and the first drain pattern in provided on a second side of the first gate electrode GE1 that is opposite to the first side. The first gate electrode GE1 has a first width W1 in the first direction D1. The first width W1 is greater than a second width W2 of a second gate GE2 or a third gate electrode GE3 which will be described below.

According to some embodiments, the first gate electrode GE1 includes two or more metal patterns. One of the metal patterns is adjacent to the first active pattern AP1. The one of the metal patterns includes a metal whose work function controls a threshold voltage of a transistor. A thickness and composition of the one of the metal patterns may be adjusted to achieve a desired threshold voltage.

According to some embodiments, the one of the metal patterns includes a metal nitride layer. For example, the one of the metal patterns includes nitrogen (N) and at least one of titanium (Ti), tantalum (Ta), aluminum (M), tungsten (W), or molybdenum (Mo). In addition, the one of the metal patterns may further include carbon (C). The one of the metal patterns may include a plurality of stacked work function metal layers.

According to some embodiments, the other of the metal patterns includes a metal whose resistance is less than that of the one of the metal patterns. For example, the other of the metal patterns includes one or more of tungsten (W), aluminum (Al), titanium (Ti), or tantalum (Ta).

According to some embodiments, a first gate spacer GS1 covers a sidewall of the first gate electrode GE1. The first gate spacer GS1 extends along the sidewall of the first gate electrode GE1, which extends in the first direction D1 and the second direction D2 and surrounds the first gate electrode GE1. The first gate spacer GS1 has a top surface at a level that is higher than that of a top surface of the first gate electrode GE1. The first gate spacer GS1 includes, for example, one or more of SiCN, SiCON, or SiN. Alternatively, the first gate spacer GS1 is a multi-layer structure that includes of two or more of SiCN, SiCON, or SiN.

According to some embodiments, a gate capping pattern GP is provided on the first gate electrode GE1. The gate capping pattern GP extends in the second direction D2 along the first gate electrode GE1. The gate capping pattern GP is surrounded by the first gate spacer GS1, when viewed in a plan view. For example, the gate capping pattern GP has a sidewall covered with the first gate spacer GS1. The gate capping pattern GP includes a material that has an etch selectivity with respect to first and second interlayer dielectric layers 110 and 120 which will be described below. The gate capping pattern GP includes, for example, one or more of SiON, SiCN, SiCON, or SiN.

According to some embodiments, a first gate dielectric layer HIL is provided between the first gate electrode GE1 and the first active pattern AP1. The first gate dielectric layer HIL extends in the second direction D2 along the first gate electrode GE1. The first gate dielectric layer HIL is surrounded by the first gate spacer GS1, when viewed in a plan view. For example, the first gate dielectric layer HIL has a sidewall covered with the first gate spacer GS1. The first gate dielectric layer HIL includes, for example, silicon oxide or silicon oxynitride. The first gate dielectric layer HIL may be formed by, for example, chemical vapor deposition (CVD).

According to some embodiments, the first gate dielectric layer HIL has a first thickness L1 in the third direction D3. The first thickness L1 ranges from about 200 Å to about 500 Å. The first thickness L1 is greater than a second thickness L2 of a second gate dielectric layer IL which will be described below.

According to some embodiments, a high-k dielectric layer HK is provided between the first gate electrode GE1 and the first gate dielectric layer HIL and between the first gate electrode GE1 and the first gate spacer GS1. The high-k dielectric layer HK covers the sidewall of the gate capping pattern GP, the sidewall of the first gate electrode GE1, and a bottom surface of the first gate electrode GE1. The high-k dielectric layer HK is surrounded by the first gate spacer GS1, when viewed in a plan view. For example, the high-k dielectric layer HK has a sidewall covered with the first gate spacer GS1.

According to some embodiments, the high-k dielectric layer HK includes a high-k dielectric material whose dielectric constant is greater than that of the first gate dielectric layer HIL. For example, the high-k dielectric layer HK includes one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

According to some embodiments, a first interlayer dielectric layer 110 is provided on the substrate 100. The first interlayer dielectric layer 110 covers a top surface STt of the device isolation layer ST, portions of the top surfaces of the first source/drain patterns SD1, and a sidewall of the first gate spacer GS1. The first interlayer dielectric layer 110 has a top surface substantially coplanar with that of the gate capping pattern GP and that of the first gate spacer GS1. A second interlayer dielectric layer 120 is provided on the first interlayer dielectric layer 110 that covers the top surface of the gate capping pattern GP and the top surface of the first gate spacer GS1. The first and second interlayer dielectric layers 110 and 120 include silicon oxide.

According to some embodiments, first active contacts AC1 are provided that penetrate the first and second interlayer dielectric layers 110 and 120 and are electrically connected with corresponding first source/drain patterns SD1. A pair of first active contacts AC1 is provided, with one of each pair on each side of the first gate electrode GE1. When viewed in a plan view, each of the first active contacts AC1 has a bar shape that extends in the second direction D2.

According to some embodiments, each of the first active contacts AC1 includes a conductive pattern FM and a barrier pattern BM that surrounds the conductive pattern FM. The conductive pattern FM includes at least one metal selected from aluminum, copper, tungsten, molybdenum, or cobalt. The barrier pattern BM covers a sidewall and a bottom surface of the conductive pattern FM. The barrier pattern BM includes a metal layer and a metal nitride layer. The metal layer includes one or more of titanium, tantalum, tungsten, nickel, or cobalt. The metal nitride layer includes one or more of a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer.

According to some embodiments, the first active contacts AC1 are self-aligned contacts. For example, the gate capping pattern GP and the first gate spacer GS1 can be used to form the first active contacts AC1 in a self-alignment manner. However, in other embodiments, the first active contacts AC1 each partially cover the sidewall of the first gate spacer GS1 or the top surface of the gate capping pattern GP.

According to some embodiments, a silicide pattern SC is provided between each of the first active contacts AC1 and each of the first source/drain patterns SD1. Each of the first active contacts AC1 is electrically connected through the silicide pattern SC to one of the first source/drain patterns SD1. The silicide pattern SC includes a metal-silicide. The silicide pattern includes, for example, one or more of titanium silicide, tantalum silicide, tungsten silicide, nickel silicide, or cobalt silicide.

According to some embodiments, a gate contact GC penetrates the second interlayer dielectric layer 120 and the gate capping pattern GP and is electrically connected with the first gate electrode GE1. The gate contact GC is provided on the device isolation layer ST. When viewed in a plan view, the gate contact GC is spaced apart in the second direction D2 from the first active pattern AP1. Like the first active contacts AC1, the gate contact GC includes a conductive pattern FM and a barrier pattern. BM that surrounds the conductive pattern FM.

According to some embodiments, a third interlayer dielectric layer 130 is provided on the second interlayer dielectric layer 120. The third interlayer dielectric layer 130 includes first wiring lines M1, a first via V1, and a second via V2. The first and second vias V1 and V2 are provided below the first wiring lines M1. The first wiring lines M1 extend in the first direction D1. The first wiring lines M1 are spaced apart in the second direction D2. The first via V1 is located between and electrically connects one of the first wiring lines M1 and one of the first active contacts AC1. The second via V2 is located between and electrically connects one of the first wiring lines M1 and the gate contact GC.

According to some embodiments, the first wiring lines M1 and one of the first and second vias V1 and V2 are integrally connected into a single conductive structure. For example, the first wiring lines M1 are simultaneously formed with one of the first and second vias V1 and V2. A dual damascene process may be performed such that the first wiring lines M1 and one of the first and second vias V1 and V2 is formed into a single conductive structure. In addition, a plurality of stacked metal layers may be disposed on the third interlayer dielectric layer 130.

According to some embodiments, a plurality of the second active patterns AP2 and the second transistors T2 are provided on the first cell region PR that are spaced apart from each other in the second direction D2. Similarly, a plurality of the third active patterns AP3 and the third transistors T3 are provided on the second cell region NR that are spaced apart from each other in the second direction D2. For convenience of description, the following will focus on a single second active pattern AP2, a single third active pattern AP3, a single second transistor T2, and a single third transistor T3, but embodiments of the present inventive concepts are not limited thereto.

According to some embodiments, the second transistor T2 on the second active pattern AP2 includes a pair of second source/drain patterns SD2 provided in an upper portion thereof, a second gate electrode GE2 that extends in the second direction D2 across the second active pattern AP2, a second gate spacer GS2 that covers a sidewall of the second gate electrode GE2, a gate capping pattern GP on the second gate electrode GE2, a second gate dielectric layer IL between the second gate electrode GE2 and the second active pattern AP2, and a high-k dielectric layer HK between the second gate electrode GE2 and the second gate dielectric layer IL and between the second gate electrode GE2 and the second gate spacer GS2. The second transistor T2 is electrically connected by the second active contacts AC2 to the first wiring lines M1 and to the pair of second source/drain patterns SD2, and is electrically by a gate contact GC to the second gate electrode GE2.

For convenience of description, repetitive explanations about the same technical features of the first transistor T1 on the peripheral region HVR will be omitted, and differences thereof will be discussed in detail below.

According to some embodiments, the second source/drain patterns SD2 in an upper portion of the second active pattern AP2 are impurity regions of a first conductivity type, such as a p-type. A channel region of the second transistor T2 is formed between the pair of second source/drain patterns SD2.

According to some embodiments, the second active pattern AP2 includes a semiconductor pattern SP in its upper portion that overlaps the second sourced/drain patterns SD2. The semiconductor pattern SP has a top surface AP2t that is a top surface of the second active pattern AP2. The semiconductor pattern SP is located in the channel region of the second transistor T2. The second source/drain patterns SD2 and the semiconductor pattern SP include a semiconductor element, such as SiGe, whose lattice constant is greater than that of a semiconductor element in the substrate 100. The second source/drain patterns SD2 provide a compressive stress to the channel region and the semiconductor pattern SP.

According to some embodiments, the second gate electrode GE2 is provided between the pair of second source/drain patterns SD2. In other words, the second source pattern is provided an a first side of the second gate electrode GE2, and the second drain pattern in provided on a second side of the second gate electrode GE2 that is opposite to the first side. The second gate electrode GE2 has a second width W2 in the first direction D1, and this is true for a third gate electrode GE3 which will be discussed below. The second width W2 is less than the first width W1 of the first gate electrode GE1 on the peripheral region HVR.

According to some embodiments, the second gate dielectric layer IL extends in the second direction D2 along the second gate electrode GE2. The second gate dielectric layer IL has a second thickness L2 in the third direction D3. The second thickness L2 ranges from about 20 Å to about 50 Å. The second thickness L2 is less than the first thickness L1 of the first gate dielectric layer HIL. The second thickness L2 is about ⅕ to about ¼ of the first thickness L1. The second gate dielectric layer IL includes, for example, silicon oxide or silicon oxynitride. The second gate dielectric layer IL may be formed by, for example, thermal oxidation.

Referring to FIGS. 2 and 3, according to some embodiments, the top surface AP2t of the second active pattern AP2 or the semiconductor pattern SP is located at a lower level than that of a portion of the top surface STt of the device isolation layer ST. The portion of the top surface STt of the device isolation layer ST that is higher than the top surface AP2t is adjacent in the first direction D1 to the second active pattern AP2

According to some embodiments, between the second and third active patterns AP2 and AP3, the top surface STt of the device isolation layer ST has a profile that includes a first convex portion CV1, a second convex portion CV2, and a concave portion CC. The first convex portion CV1, the second convex portion CV2, and the concave portion CC are each characterized as a section at which a slope of the profile changes from positive to negative or vice versa. For example, the first and second convex portions CV1 and CV2 are each a convexly protruding, segment, and the concave portion CC is a concavely recessed segment.

According to some embodiments, the first convex portion CV1 is adjacent to the second active pattern AP2 on the first cell region PR, and the second convex portion CV2 is adjacent to the third active pattern AP3 on the second cell region NR. The second convex portion CV2 adjacent to the third active pattern AP3 is located at a higher level than the first convex portion CV1 adjacent to the second active pattern AP2.

According to some embodiments, a maximum height difference ΔH1 between the top surface STt of the device isolation layer ST and either the top surface AP2t of the second active pattern AP2 or the top surface AP3t of the third active pattern AP3 is about 200 Å or more. For example, the maximum height difference ΔH1 may range from about 200 Å to about 400 Å. A maximum height difference ΔH1 of about 200 Å or greater can increase the accuracy of ion implantation on the second active pattern AP2 or the third active pattern AP3 when fabricating a semiconductor device, and thus the semiconductor device may have increased electrical characteristics and reliability.

FIG. 3 depicts the maximum height difference ΔH1 as between the second convex portion CV2 and the top surface AP3t of the third active pattern AP3, but embodiments of the present inventive concepts are not limited thereto, and the maximum height difference ΔH1 may be between the top surface AP3t of the third active pattern AP3 and a higher of the first and second convex portions CV1 and CV2.

Referring to FIGS. 4 and 5, according to some embodiments, the top surface AP2t of the second active pattern AP2 or the semiconductor pattern SP is located at a higher level than that of the top surface STt of the device isolation layer ST. The top surface STt of the device isolation layer ST is adjacent in the second direction D2 to the second active pattern AP2, and the top surface STt is located at a lower level than that of the top surface AP2t of the second active pattern AP2.

For example, according to some embodiments, when viewed in the cross-section shown in FIG. 4, between a plurality of neighboring second active patterns AP2, the top surface STt of the device isolation layer ST is located at a lower level than the top surface AP2t of each of the second active patterns AP2. However, in other embodiments, the top surface STt of the device isolation layer ST has a profile that includes a concave portion at a location adjacent to each of the second active patterns AP2. A maximum height difference ΔH2 between the top surface AP2t of each of the second active patterns AP2 and the top surface STt of the device isolation layer ST between the second active patterns AP2 is about 100 Å or less. For example, the maximum height difference ΔH2 ranges from about 30 Å to about 100 Å. When the maximum height difference ΔH2 is equal to or less than about 100 Å, the second gate spacer GS2 contacts the top surface STt of the device isolation layer ST, and the high-k dielectric layer HK continuously extends without interruption on the semiconductor pattern SP and the device isolation layer ST.

The device isolation layer ST between a plurality of neighboring second active patterns AP2 has been described with reference to FIGS. 4 and 5, and the same description substantially applies to the device isolation layer ST between a plurality of neighboring first active patterns AP1 and to the device isolation layer ST between a plurality of neighboring third active patterns AP3.

According to some embodiments, a portion of each of the second gate electrode GE2, the high-k dielectric layer HK, and the second gate dielectric layer IL are located at a lower level than the top surface AP2t of the second active pattern AP2. A portion of the second gate spacer GS2 contacts the top surface STt of the device isolation layer ST. The portion of the second gate spacer GS2 is adjacent in the second direction D2 to the second active pattern AP2 and is in contact with the top surface STt of the device isolation layer ST. The second gate spacer GS2 covers a sidewall HKs of the high-k dielectric layer HK and a sidewall ILs of the second gate dielectric layer IL. Like the second gate spacer GS2, a third gate spacer GS3 which will be discussed below contacts the top surface STt of the device isolation layer ST and covers a lateral surface HKs of a high-k dielectric layer HK and a sidewall ILs of a second gate dielectric layer IL. Therefore, it is possible to minimize or prevent introduction of etching solutions, etc., into the high-k dielectric layer HK or the second gate dielectric layer IL during fabrication, which increases the electrical characteristics and reliability of the semiconductor device.

According to some embodiments, the semiconductor pattern SP has a width SPW in the second direction D2 that is equal to or less than a width AP2W in the second direction D2 of the second active pattern AP2. For example, the width SPW in the second direction D2 of the semiconductor pattern SP is substantially equal to the width AP2W in the second direction D2 of the second active pattern AP2. For this reason, an overhang that can occur when the second gate dielectric layer IL and the high-k dielectric layer HK are formed on the semiconductor pattern SP can be minimized or prevented, and thus the second gate dielectric layer IL and the high-k dielectric layer HK can continuously extend without interruption on the semiconductor pattern SP and the device isolation layer ST, with the result that a semiconductor device has increased electrical characteristics and reliability.

According to some embodiments, the third transistor T3 on the third active pattern AP3 includes a pair of third source/drain patterns SD3 in an upper portion of the third active pattern AP3, a third gate electrode GE3 that extends in the second direction D2 across the third active pattern AP3, a third gate spacer GS3 that covers a sidewall of the third gate electrode GE3, a gate capping pattern GP on the third gate electrode GE3, a second gate dielectric layer IL between the third gate electrode GE3 and the third active pattern AP3, and a high-k dielectric layer HK between the third gate electrode GE3 and the second gate dielectric layer IL and between the third gate electrode GE3 and the third gate spacer GS3. The third transistor T3 is electrically connected by the third active contacts ACs to the first wiring lines M1 and to the pair of third source/drain patterns SD3, and is electrically connected by the gate contact to the third gate electrode GE3.

For convenience of description, repetitive explanations of the same technical features of the first transistor T1 on the peripheral region HVR or the second transistor T2 on the first cell region PR will be omitted, and differences thereof will be discussed in detail below.

According to some embodiments, the third source/drain patterns SD3 in an upper portion of the third active pattern AP3 have a conductivity type that differs from that of the second source/drain patterns SD2 in an upper portion of the second active pattern AP2. The third source/drain patterns SD3 are impurity regions of a second conductivity type, such as an n-type. A channel region of the third transistor T3 is located between the pair of third source/drain patterns SD3. Unlike the second active pattern AP2 that have the semiconductor pattern SP disposed therein, no semiconductor pattern is disposed in the upper portion of the third active pattern AP3.

According, to some embodiments, the third gate electrode GE3 is located between the pair of third source/drain patterns SD3. In other words, the third source pattern is provided an a first side of the third gate electrode GE3, and the third drain pattern in provided on a second side of the third gate electrode GE3 that is opposite to the first side. The third gate electrode GE3 has a width in the first direction D1 substantially the same as that of the second gate electrode GE2 in the first direction D1. The third gate electrode GE3 has a second width W2 in the first direction D1. The second width W2 is less than the first width W1 of the first gate electrode GE1.

According to some embodiments, the second gate dielectric layer IL extends in the second direction D2 along the third gate electrode GE3. The second gate dielectric layer IL has a second thickness L2 in the third direction D3. The second thickness L2 ranges from about 20 Å to about 50 Å.

FIGS. 6 to 12 are cross-sectional views taken along line I-I' of FIG. 1, that illustrate a method of fabricating a semiconductor device according to some embodiments of the present inventive concepts. The following will describe in detail a method of fabricating a semiconductor device according to some embodiments of the present inventive concepts with reference to FIGS. 6 to 12 and 1 to 5.

Figure 6:
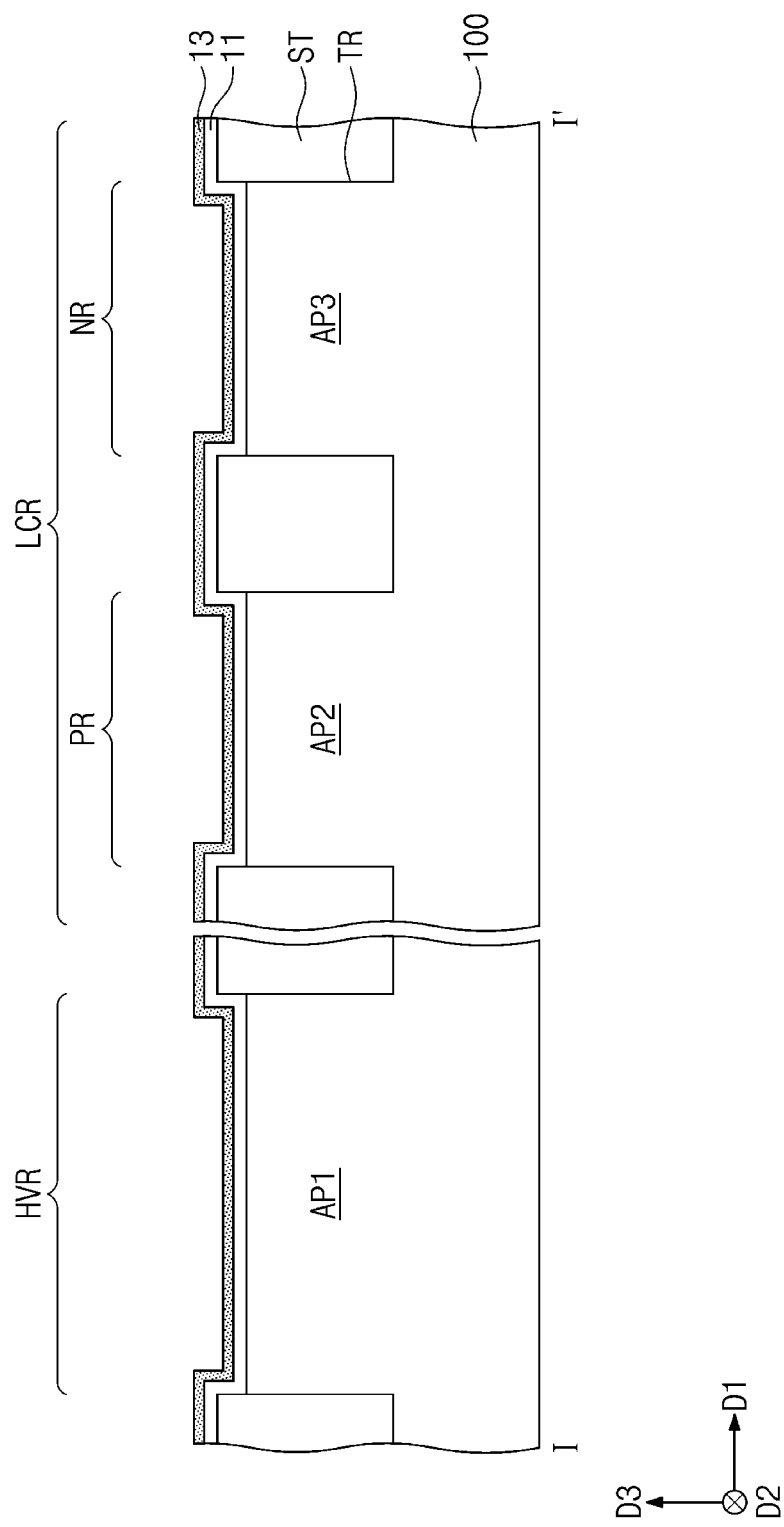
FIGS. 6 to 12 are cross-sectional views taken along line I-I' of FIG. 1 that illustrate a method of fabricating a semiconductor device according to some embodiments of the present inventive concepts.

Referring to FIG. 6, according to some embodiments, a substrate 100 is prepared that includes a peripheral region HVR and a logic cell region LCR. The logic cell region LCR includes a first cell region PR and a second cell region NR. The substrate 100 is patterned to form a trench TR, and thus a first active pattern AP1 is formed on the peripheral region HVR, and a second active pattern AP2 and a third active pattern AP3 are formed on the logic cell region LCR. Afterwards, a device isolation layer ST is formed that fills a space between the first, second, and third active patterns AP1, AP2, and AP3. The device isolation layer ST may be formed by filling the trench TR with a dielectric material, and performing a planarization process on the dielectric material until top surfaces of the first, second, and third active patterns AP1, AP2, and AP3 are exposed. The first, second, and third active patterns AP1, AP2, and AP3 may be partially removed during the planarization process, and have their top surfaces at a lower level than that of a top surface of the device isolation layer ST.

According to some embodiments, a first dielectric layer 11 and a second dielectric layer 13 are formed that conformally cover the device isolation layer ST and the first, second, and third active patterns AP1, AP2, and AP3. The first and second dielectric layers 11 and 13 include materials that differ from each other. For example, the first dielectric layer 11 includes silicon oxide, and the second dielectric layer 13 includes silicon nitride. The first dielectric layer 11 has a thickness of, for example, about 200 Å to about 500 Å.

Figure 7:
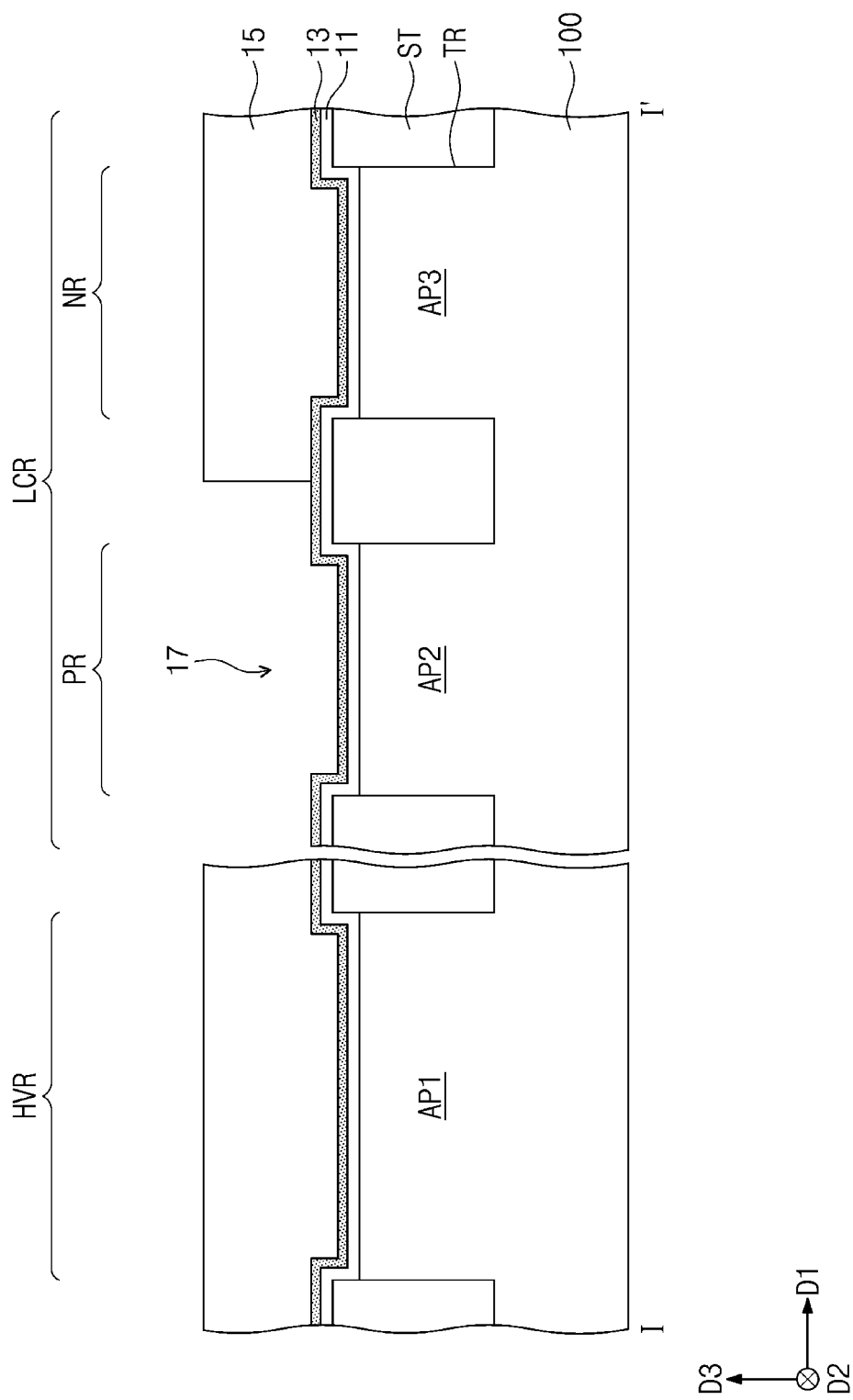

Referring to FIG. 7, according to some embodiments, a first photoresist pattern 15 is formed. The first photoresist pattern 15 has a first opening 17 that exposes the first cell region PR of the substrate 100. The first opening 17 partially exposes the second dielectric layer 13 on the second active pattern AP2. For example, the first photoresist pattern 15 is not formed on an area that overlaps the second active pattern AP2, but covers areas that overlap the first active pattern AP1 and the third active pattern AP3.

Figure 8:
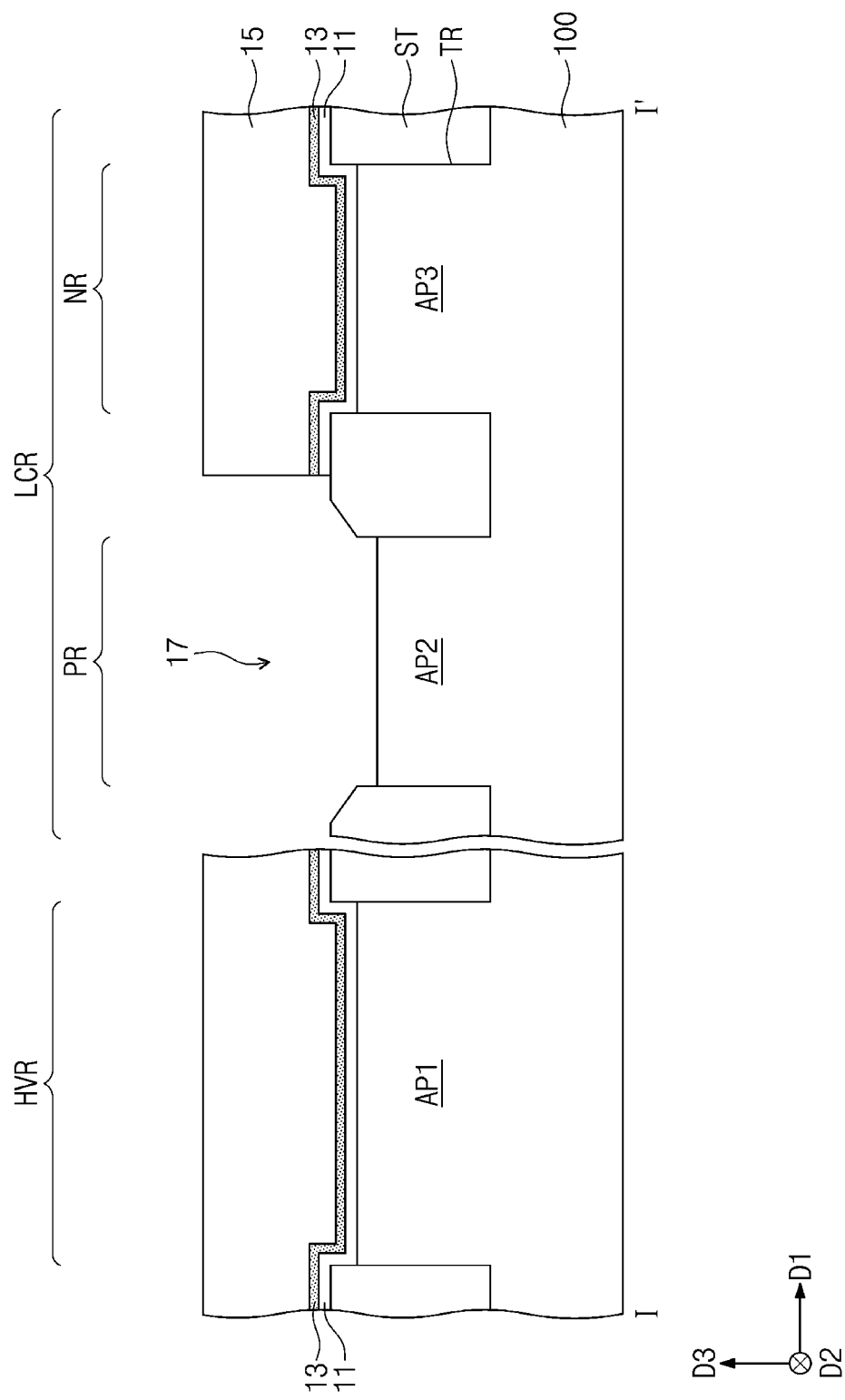

Referring to FIG. 8, according to some embodiments, the first photoresist pattern 15 is used as a mask with a first etching process that partially removes the second active pattern AP2 and also partially removes the first and second dielectric layers 11 and 13 on the second active pattern AP2. For example, the first etching process may be a wet etching process that uses a solution of hydrogen fluoride (HF) in water. The first etching process externally exposes the top surface of the second active pattern AP2 and a portion of the top surface of the device isolation layer ST. After the first etching process is terminated, the first photoresist pattern 15 is removed.

Figure 9:
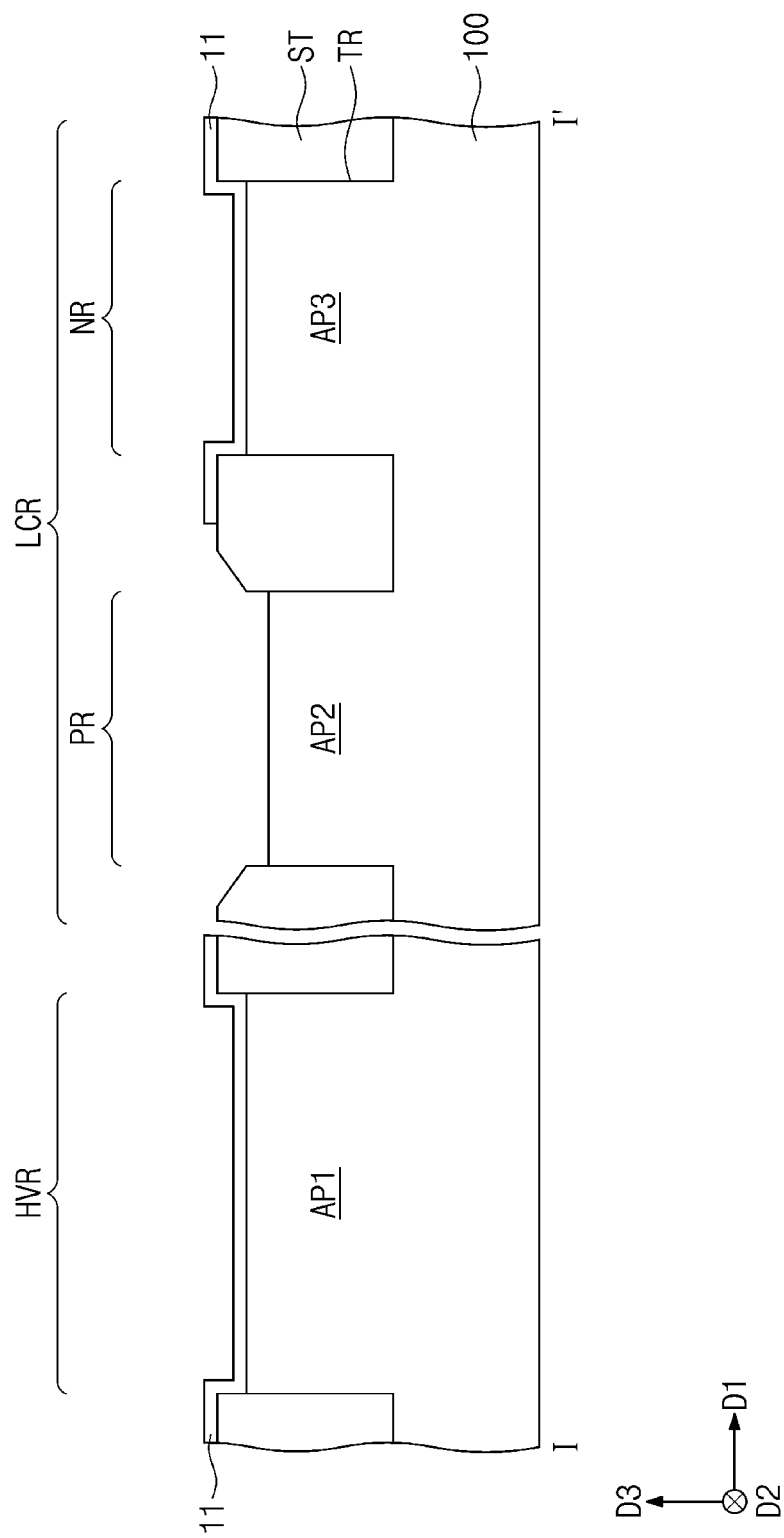

Referring to FIG. 9, according to some embodiments, the second dielectric layer 13 is removed from the first and second active patterns AP1 and AP3. The removal of the second dielectric layer 13 externally exposes the first dielectric layer 11. According to some embodiments of the present inventive concepts, before forming the semiconductor pattern SP, described below, an etching process is performed once that removes silicon oxide, such as the first dielectric layer 11 on the second active pattern AP2.

According to some embodiments of the present inventive concepts, it is possible to expose only the top surface of the second active pattern AP2 and to form it semiconductor pattern SP, described below, without removing the first dielectric layer 11 on the first and second cell regions PR and NR, without growing an oxide layer to prevent deposition of a semiconductor material on the second cell region NR, or without removing an oxide layer on the first cell region PR, and accordingly, manufacturing cost and time can be reduced and the device isolation layer ST can be minimized or prevented from being unnecessarily recessed.

As the device isolation layer ST is minimized or prevented from being unnecessarily recessed, as described with reference to FIGS. 2 and 3, a step difference of about 200 Å or higher can be maintained between the top surface STt of the device isolation layer ST and the top surfaces of the second and third active patterns AP2 and AP3, and as described with reference to FIG. 4, the device isolation layer T adjacent to each of the second active patterns AP2 can be recessed to a depth of about 100 Å or less, which increases electrical characteristics and reliability of a semiconductor device.

Figure 10:
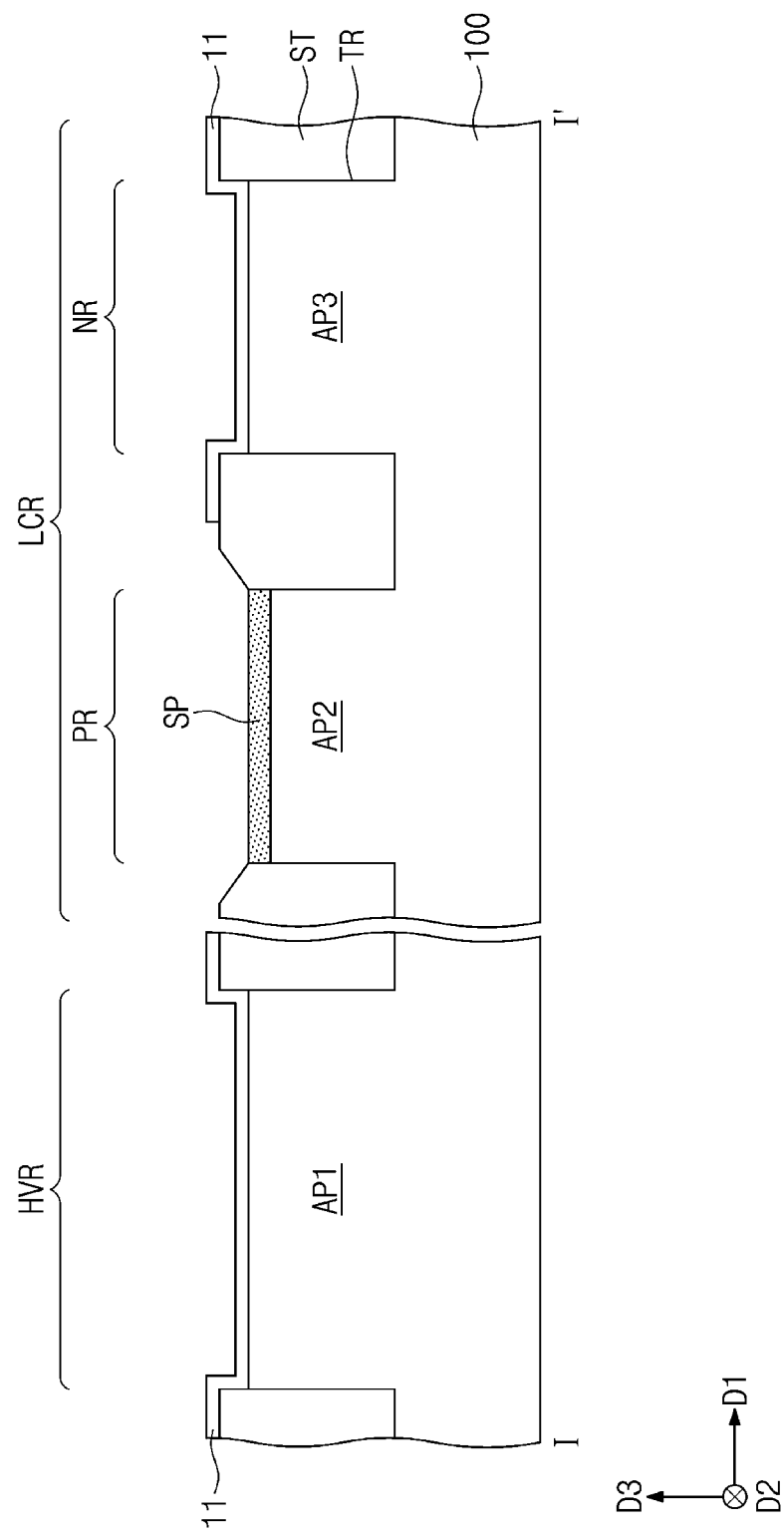

Referring to FIG. 10, according to some embodiments, a semiconductor pattern SP is formed on the exposed second active pattern AP2. The semiconductor pattern SP includes a semiconductor material, such as SiGe, whose lattice constant is greater than that of a semiconductor material in the substrate 100. The formation of the semiconductor pattern SP includes repeatedly depositing a semiconductor material on the substrate 100 and removing the semiconductor material from the device isolation layer ST and the first dielectric layer 11. The semiconductor material has a thickness greater on the second active pattern AP2 than on the device isolation layer ST and the first dielectric layer 11, and the semiconductor material is removed from the device isolation layer ST and the first dielectric layer 11 by repetitive removal. Therefore, the semiconductor pattern SP is formed selectively on the second active pattern AP2, and is not formed on either the device isolation layer ST or on the first dielectric layer 11.

Figure 11:
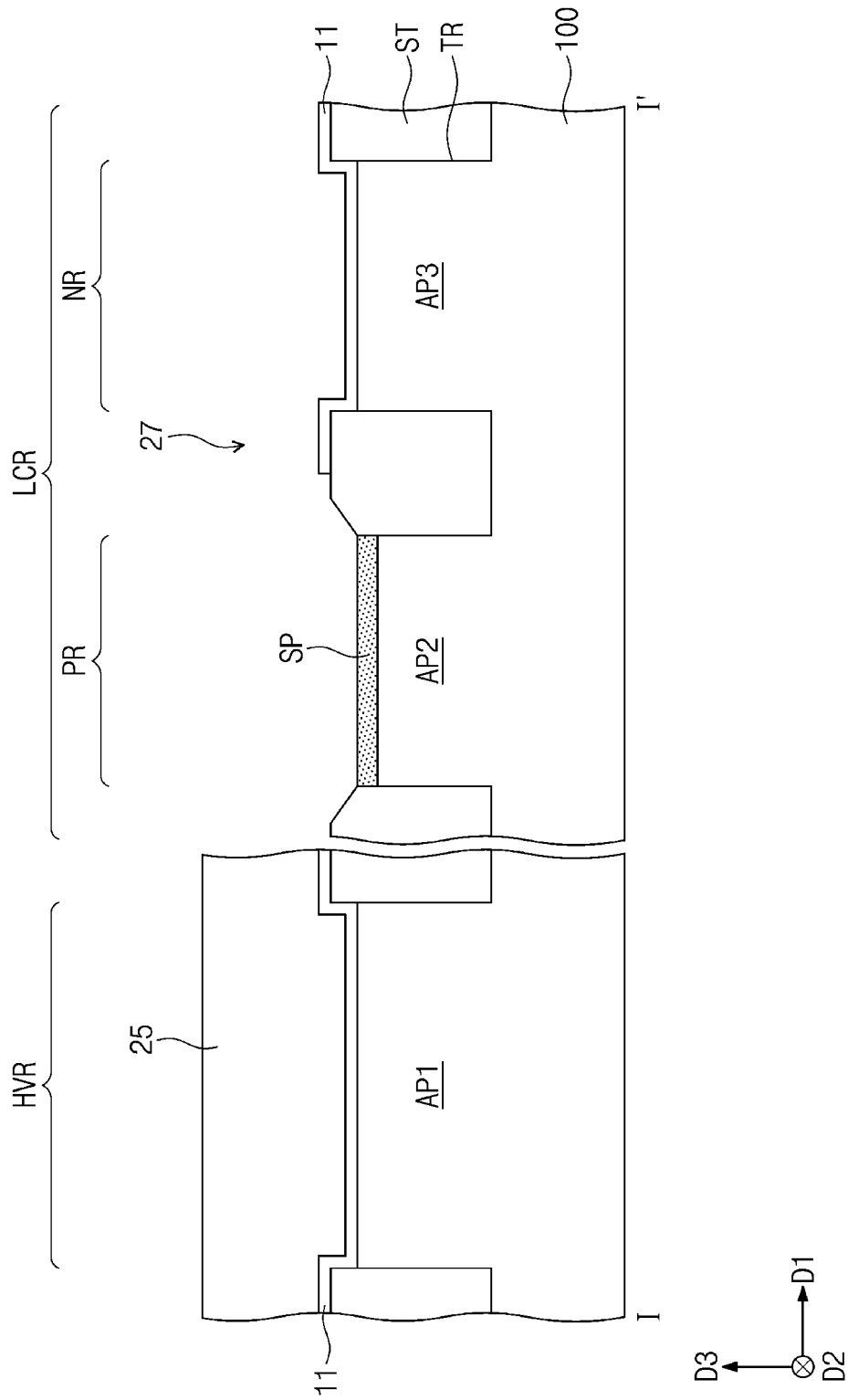
Figure 12:
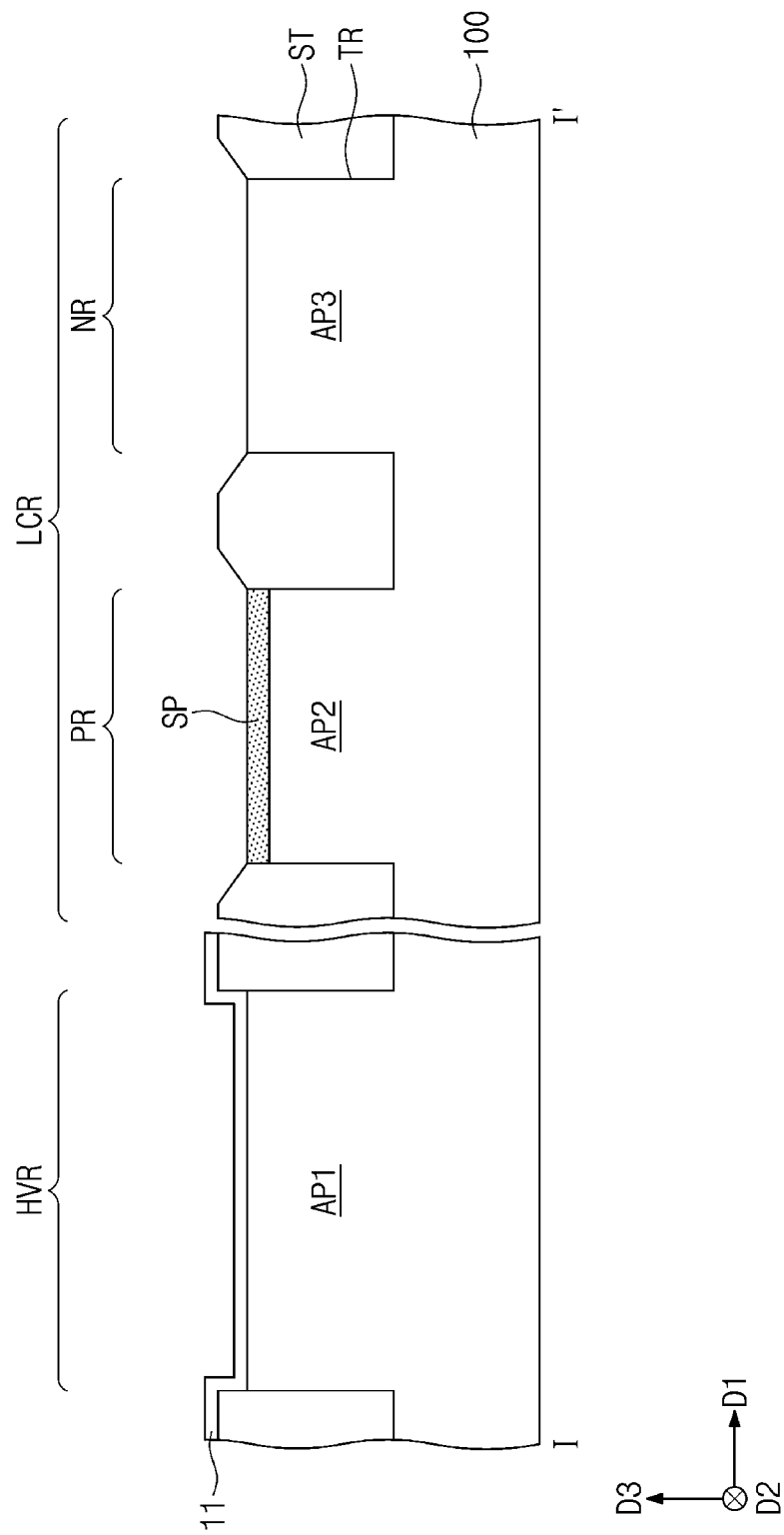

Referring to FIGS. 11 and 12, according to some embodiments, a second photoresist pattern 25 is formed. The second photoresist pattern 25 has a second opening 27 that exposes the logic cell region LCR of the substrate 100. The second opening, 27 exposes the semiconductor pattern SP on the second active pattern AP2 and a portion of the first dielectric layer 11 on the third active pattern AP3. For example, the second photoresist pattern 25 is not formed on areas that overlap the second and third active patterns AP2 and AP3, and covers an area that overlaps the first active pattern AP1.

According to some embodiments, the second photoresist pattern 25 is used as a mask with a second etching process that removes the first dielectric layer 11 that remains on the third active pattern AP3. When the second photoresist pattern 25 is used in removing the first dielectric layer 11, at least a portion of the semiconductor pattern SP is also removed from the second active pattern AP2. The second etching process may be, for example, a wet etching process that uses a solution of hydrogen fluoride (HF) in water. The second etching process externally exposes a top surface of the semiconductor pattern SP, the top surface of the third active pattern AP3, and a portion of the top surface of the device isolation layer ST. After the second etching process is terminated, the second photoresist pattern 25 is removed.

Even after the termination of the second etching process, some of the first dielectric layer 11 may remain on the first active pattern AP1.

According to some embodiments, owing to the first and second etching processes, the top surface of the device isolation layer ST between the second and third active patterns AP2 and AP3 has a profile that includes the first convex portion CV1, the second convex portion CV2, and the concave portion CC as shown in FIG. 3.

Referring back to FIGS. 1, 2, and 4, according to some embodiments, first, second, and third transistors T1, T2, and T3 are respectively formed on the first, second, and third active patterns AP1, AP2, and AP3. The formation of the first, second, and third transistors T1, T2, and T3 includes conformally depositing a third dielectric layer on an entire surface of the substrate 100, forming a sacrificial layer and hardmask patterns on the entire surface of the substrate 100, using the hardmask patterns as an etching mask to pattern the sacrificial layer to form sacrificial patterns, patterning the third dielectric layer and the first dielectric layer 11 not covered with the sacrificial patterns to form a first gate dielectric layer HIL on the peripheral region HVR and a second gate dielectric layer IL on the logic cell region LCR, forming first, second, and third gate spacers GS1, GS2, and GS3 that cover sidewalls of the sacrificial patterns, forming first, second, and third source/drain patterns SD1, SD2, and SD3 in upper portions of the first, second, and third active patterns AP1, AP2, and AP3 on both sides of the sacrificial patterns, forming a first interlayer dielectric layer 110 to cover the first, second, and third active patterns AP1, AP2, and AP3, and forming high-k dielectric layers, first, second, and third gate electrodes GE1, GE2, and GE3, and gate capping patterns GP in empty spaces from which the sacrificial patterns are removed. The third dielectric layer includes silicon oxide, and the sacrificial layer, or the sacrificial patterns, includes polysilicon.

According to some embodiments of the present inventive concepts, a method of fabricating a semiconductor device includes forming the first, second, and third transistors T1, T2, and T3 as discussed above, and further includes forming a second interlayer dielectric layer 120 that covers the first interlayer dielectric layer 110, forming first, second, and third active contacts AC1, AC2, and AC3 that penetrate the first and second interlayer dielectric layers 110 and 120 and respectively electrically connect with the first, second, and third gate electrodes GE1, GE2, and GE3, forming a third interlayer dielectric layer 130 that covers the second interlayer dielectric layer 120, and forming first wiring lines M1, a first via V1, and a second via V2 in the third interlayer dielectric layer 130.

In semiconductor device fabrication methods according to some embodiments of the present inventive concepts, without growth or removal of an oxidation layer on an entire region, it is possible to expose only a top surface of a portion of the active patterns and to form a semiconductor pattern, and accordingly, a manufacturing cost and time can be reduced and a device isolation layer can be minimized or prevented from being unnecessarily recessed. In conclusion, a semiconductor device according to some embodiments of the present inventive concepts has increased reliability and electrical characteristics.

Although embodiments of the present inventive concepts have been described in connection with the some embodiments of the present inventive concepts illustrated in the accompanying drawings, it will be understood by one of ordinary skill in the art that variations in form and detail may be made therein without departing from the spirit and essential features of the present inventive concepts. The above disclosed embodiments should thus be considered illustrative and not restrictive.

What is claimed is:

1. A semiconductor device, comprising:
a substrate that includes a peripheral region and a logic cell region;
a device isolation layer that defines a first active pattern on the peripheral region, a second active pattern on the logic cell region, and a third active pattern on the logic cell region; and
first, second, and third transistors on the first, second, and third active patterns, respectively,
wherein each of the first, second, and third transistors includes a gate electrode, a gate spacer that covers a sidewall of the gate electrode, a source pattern on a first side of the gate electrode and a drain pattern on a second side of the gate electrode opposite to the first side,
wherein the second active pattern includes a semiconductor pattern in an upper portion of the second active pattern, wherein the semiconductor pattern overlaps the gate electrode,
wherein at least a portion of a top surface of the device isolation layer is located at a higher level than a top surface of the second active pattern and a top surface of the third active pattern, and
wherein a profile of the top surface of the device isolation layer includes two or more convex portions between the second active pattern and the third active pattern.

2. The semiconductor device of claim 1, wherein the two or more convex portions include a first convex portion and a second convex portion,
wherein the first convex portion is adjacent to the second active pattern,
wherein the second convex portion is adjacent to the third active pattern, and
wherein the second convex portion is located at a higher level than the first convex portion.

3. The semiconductor device of claim 1, wherein, between the second active pattern and the third active pattern, a maximum height difference between the top surface of the device isolation layer and the top surface of the third active pattern is in a range from about 200 Å to about 400 Å.

4. The semiconductor device of claim 1, wherein the semiconductor device further comprises:
a first gate dielectric layer provided between the first active pattern and the gate electrode of the first transistor; and
a second gate dielectric layer provided between each of the second and third active patterns and the gate electrode of each of the second and third transistors, wherein
a thickness of the first gate dielectric layer is greater than a thickness of the second gate dielectric layer.

5. The semiconductor device of claim 4, wherein
the thickness of the first gate dielectric layer is in a range of about 200 Å to about 500 Å, and
the thickness of the second gate dielectric layer is in a range of about 20 Å to about 50 Å.

6. The semiconductor device of claim 4, wherein each of the second and third transistors further includes a high-k dielectric layer between the gate electrode and the second gate dielectric layer and between the gate electrode and the gate spacer, wherein the gate spacer covers a sidewall of the high-k dielectric layer and a sidewall of the second gate dielectric layer.

7. The semiconductor device of claim 1, wherein a portion of the gate spacer included in each of the second and third transistors is in contact with the top surface of the device isolation layer.

8. The semiconductor device of claim 1, wherein a width of the gate electrode in the first transistor is greater than a width of the gate electrode in each of the second and third transistors.

9. The semiconductor device of claim 1, wherein the semiconductor pattern includes silicon germanium (SiGe).

* * * * *